(12) United States Patent
Zou

(10) Patent No.: US 9,825,112 B2
(45) Date of Patent: Nov. 21, 2017

(54) ARRAY SUBSTRATE, DISPLAY PANEL AND DISPLAY DEVICE

(71) Applicant: Boe Technology Group Co., Ltd., Beijing (CN)

(72) Inventor: Xiangxiang Zou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 56 days.

(21) Appl. No.: 14/892,684

(22) PCT Filed: Aug. 14, 2015

(86) PCT No.: PCT/CN2015/086980
§ 371 (c)(1),
(2) Date: Nov. 20, 2015

(87) PCT Pub. No.: WO2016/150078
PCT Pub. Date: Sep. 29, 2016

(65) Prior Publication Data
US 2017/0092698 A1    Mar. 30, 2017

(30) Foreign Application Priority Data

Mar. 20, 2015  (CN) .......................... 2015 1 0126336

(51) Int. Cl.
*H01L 27/32*    (2006.01)
(52) U.S. Cl.
CPC ........ *H01L 27/326* (2013.01); *H01L 27/3248* (2013.01); *H01L 27/3258* (2013.01); *H01L 27/3276* (2013.01)
(58) Field of Classification Search
None
See application file for complete search history.

(56) References Cited

U.S. PATENT DOCUMENTS

2005/0052605 A1* 3/2005 Okumura .............. G02F 1/1393
                                                                    349/146
2007/0264899 A1   11/2007 Kumagai
2012/0113376 A1   5/2012 Hayashi et al.

FOREIGN PATENT DOCUMENTS

CN    102183860    9/2011
CN    102903732    1/2013
(Continued)

OTHER PUBLICATIONS

International Search Report and Written Opinion from PCT/CN2015/086980 dated Sep. 24, 2015.
(Continued)

*Primary Examiner* — Michelle Mandala
(74) *Attorney, Agent, or Firm* — Calfee, Halter & Griswold LLP

(57) ABSTRACT

The present disclosure discloses an array substrate, display panel and display device. The array substrate comprises: a base substrate, and peripheral routes and a plurality of pixel structures located on the base substrate. The orthographic projection of at least one pixel structure on the base substrate has an overlapping region with the periphery region in which the peripheral routes reside. The film layer where the peripheral routes reside is located between the film layer where the pixel structures reside and the base substrate or located at a side of the film layer. The array substrate allows the display region to be enlarged to cover a part or all of the periphery region where the peripheral routes reside. This can narrow down the bazel width of the display panel and even make it bezel-less.

16 Claims, 5 Drawing Sheets

(56) References Cited

FOREIGN PATENT DOCUMENTS

| | | |
|---|---|---|
| CN | 103792749 | 5/2014 |
| CN | 104360558 | 2/2015 |
| CN | 104701352 | 6/2015 |
| JP | 2004-045756 | 2/2004 |

OTHER PUBLICATIONS

Office Action from China Application No. 201510126336.7 dated Feb. 27, 2017.

\* cited by examiner

ARRAY SUBSTRATE, DISPLAY PANEL AND DISPLAY DEVICE

RELATED APPLICATIONS

This application is the U.S. national phase entry of PCT/CN2015/086980, filed Aug. 14, 2015, which claims priority to Chinese Application Serial No. 201510126336.7, filed Mar. 20, 2015, the entire disclosures of which are incorporated by reference.

FIELD

The present disclosure relates to the display technology field and, in particular, to an array substrate, display panel and display device.

BACKGROUND

As the display technologies continue to develop, there is shown a rapid growth in the development of flat panel displays such as light emitting diode (LED), organic light emitting diode (OLED), plasma display panel (PDP), and so on.

Currently, a trend in the display field is "Narrow Bezel" or even "Bezel-less". Take a prior art OLED for example. An array substrate of an OLED, as shown in FIG. 1, comprises a display region 101 and a periphery region 102 surrounding the display region 101. The display region 101 is arranged internally with a plurality of pixel structures 103 for displaying, the periphery region 102 is arranged internally with peripheral routes 104 for loading drive signals to individual pixel structures 103, and the width of the periphery region 102 is the width of the OLED bezel (as shown by "a" in FIG. 1). In order to accomplish the design of Narrow Bezel, generally the technique of integrating a gate drive circuit onto the OLED array substrate (Gate On Array, or GOA) is used, i.e. forming the gate drive circuit in the periphery region of the array substrate. However, the gate drive circuit integrated on the OLED array substrate would still occupy certain width, which limits the development of a Narrow Bezel for the OLED.

Therefore, there is an need for those skilled in the art to solve the technical problem of how to further reduce the bezel width of flat panel displays.

SUMMARY

In view of above, an array substrate, display panel and display device are provided in embodiments of the present disclosure, which at least alleviates or eliminates the above problem in the prior art.

Thus, in a first aspect of the present disclosure, an array substrate is provided, comprising: a base substrate, and peripheral routes and a plurality of pixel structures located on said base substrate;

an orthographic projection of at least one said pixel structure on said base substrate having an overlapping region with the orthographic projection of the periphery region, where said peripheral routes reside, on said base substrate; and a film layer where said peripheral routes reside that is located between the film layer where said pixel structures reside and said base substrate; or the film layer where said peripheral routes reside that is located at a side of the film layer where said pixel structures reside facing away from said base substrate.

In a possible implementation, the array substrate may further comprise: a plurality of data lines and a plurality of gate lines on said base substrate, which intersect each other and mutually insulative; each said data line and each said gate line having orthographic projections on said base substrate, which are non-overlapping with the orthographic projection of said peripheral routes on said base substrate;

for pixel structures located outside said overlapping region and the gate lines and data lines corresponding to the pixel structures, two adjacent data lines and two adjacent gate lines define one pixel structure.

In a possible implementation, the film layer where said peripheral routes reside may be located between the film layer where said pixel structures reside and said base substrate; said array substrate may further comprise: a thin film transistor corresponding to each said pixel structure, a first passivation layer, a metal bridge and a second passivation layer, which are located between said base substrate and the film layer where said pixel structures reside and are arranged in sequence on said base substrate; said pixel structure is an organic electroluminescent structure;

a drain of a thin film transistor corresponding to an organic electroluminescent structure located in said overlapping region that is electrically connected to said metal bridge by a first via hole penetrating said first passivation layer, and said metal bridge that is electrically connected to an anode in said organic electroluminescent structure by a second via hole penetrating said second passivation layer;

a drain of a thin film transistor corresponding to an organic electroluminescent structure located outside said overlapping region that is electrically connected to an anode in said organic electroluminescent structure by a third via hole penetrating said first passivation layer and said second passivation layer.

In a possible implementation, the array substrate may further comprise an organic resin layer arranged on said second passivation layer, said second via hole penetrating said organic resin layer and said second passivation layer, said third via hole penetrating the organic resin layer, second passivation layer and first passivation layer.

In a possible implementation, the film layer where said peripheral routes reside may be located at a side of the film layer, where said pixel structures reside, facing away from said base substrate; said array substrate may further comprise: a second passivation layer, a metal bridge, a first passivation layer and a thin film transistor corresponding to each said pixel structure, arranged in sequence at the side of the film layer where said pixel structures reside facing away from said base substrate; said pixel structure is an organic electroluminescent structure;

a drain of a thin film transistor corresponding to an organic electroluminescent structure located in said overlapping region that is electrically connected to said metal bridge by a first via hole penetrating said first passivation layer, and said metal bridge is electrically connected to an anode in said organic electroluminescent structure by a second via hole penetrating said second passivation layer;

a drain of a thin film transistor corresponding to an organic electroluminescent structure located outside said overlapping region that is electrically connected to an anode in said organic electroluminescent structure by a third via hole penetrating said first passivation layer and said second passivation layer.

In a possible implementation, the array substrate may further comprise: a plurality of data lines and a plurality of gate lines on said base substrate, which intersect each other and mutually insulative; each said data line and each said gate line having orthographic projections on said base substrate, which are non-overlapping with the orthographic projection of said peripheral routes on said base substrate;

a width of each said pixel structure along the direction in which said gate lines extend is larger than a distance between two adjacent data lines; and/or a width of each said pixel structure along the direction in which said data lines extend is larger than a distance between two adjacent gate lines.

In a possible implementation, the film layer where said peripheral routes reside may be located between the film layer where said pixel structures reside and said base substrate; and said array substrate may further comprise: a thin film transistor corresponding to each said pixel structure and a first passivation layer, which are located between said base substrate and the film layer where said pixel structures reside and are arranged in sequence on said base substrate; said pixel structure is an organic electroluminescent structure;

an anode in each said organic electroluminescent structure is electrically connected to a drain in said corresponding thin film transistor by a first via hole in said first passivation layer.

In a possible implementation, in said array substrate provided by an embodiment of the present disclosure, it may further comprise: a metal bridge and a second passivation layer arranged in sequence on said first passivation layer; wherein, said metal bridge is electrically connected to a drain in said thin film transistor by a first via hole in said first passivation layer, and said metal bridge is electrically connected to an anode in said organic electroluminescent structure by a second via hole in said second passivation layer.

In a possible implementation, in said array substrate provided by an embodiment of the present disclosure, the film layer where said peripheral routes reside may be located at a side of the film layer, where said pixel structures reside, facing away from said base substrate; said array substrate may further comprise: a first passivation layer and a thin film transistor corresponding to each said pixel structure, arranged in sequence at the side of the film layer where said pixel structures reside facing away from said base substrate; said pixel structure is an organic electroluminescent structure;

an anode in each said organic electroluminescent structure is electrically connected to a drain in said corresponding thin film transistor by a first via hole in said first passivation layer.

In a possible implementation, the array substrate may further comprise: a metal bridge and a second passivation layer arranged in sequence on said first passivation layer; wherein, said metal bridge is electrically connected to an anode in said organic electroluminescent structure by a first via hole in said first passivation layer, and said metal bridge is electrically connected to a drain in said thin film transistor by a second via hole in said second passivation layer.

In a possible implementation, in said array substrate provided by an embodiment of the present disclosure, said metal bridge may be bar-shaped; individual said metal bridges are located on different straight lines parallel with said gate lines.

In a possible implementation, in said array substrate provided by an embodiment of the present disclosure, it may further comprise a periphery circuit;

the film layer where said peripheral routes reside and the film layer where said periphery circuit resides are located between the film layer where said pixel structures reside and said base substrate; or the film layer where said peripheral routes reside and the film layer where said periphery circuit resides are located at a side of the film layer, where said pixel structures reside, facing away from said base substrate.

A display panel is also provided in embodiments of the present disclosure, comprising: said array substrate provided by an embodiment of the present disclosure.

In a possible implementation, in said display panel provided by an embodiment of the present disclosure, said display panel is an organic electroluminescent display panel.

A display device is also provided in embodiments of the present disclosure, comprising: said display panel provided by an embodiment of the present disclosure.

In said array substrate, display panel and display device provided by embodiments of the present disclosure, said array substrate comprises: a base substrate, and peripheral routes and a plurality of pixel structures located on said base substrate. Since the orthographic projection of at least one pixel structure on the base substrate has an overlapping region with the periphery region in which the peripheral routes reside, i.e. the pixel structure extends to cover a part or all of the periphery region where the peripheral routes reside, and since the film layer where the peripheral routes reside is located between the film layer where the pixel structures reside and the base substrate or located at a side of the film layer, where the pixel structures reside, facing away from the base substrate, normal display with the pixel structures would not be affected even if the orthographic projection of the pixel structures on the base substrate and the periphery region where the peripheral routes reside overlap each other, thus enabling the display region to be enlarged to cover a part or all of the periphery region where the peripheral routes reside. This, compared with a structure without the overlapping of the display region and the periphery region, can narrow down the bazel width of the display panel and even make it bezel-less.

DETAILED DESCRIPTION

Figure 1:
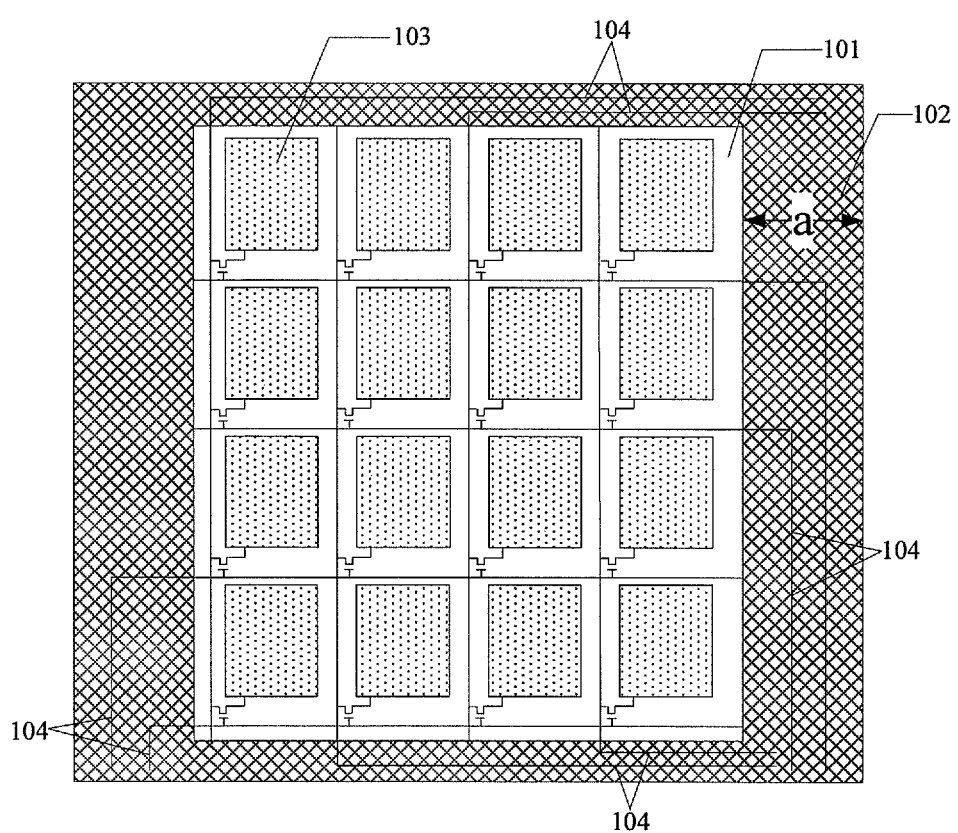
FIG. 1 is a schematic diagram of the structure of an array substrate of a prior art organic electroluminescent display panel.

In the following the specific implementation of an array substrate, display panel and display device provided by embodiments of the present disclosure will be described in detail in conjunction with the accompanying drawings.

In the drawings, the shape and the thickness of each film layer are not necessarily of a real scale of the array substrate, but are only drawn to illustrate the present disclosure.

Figure 2:
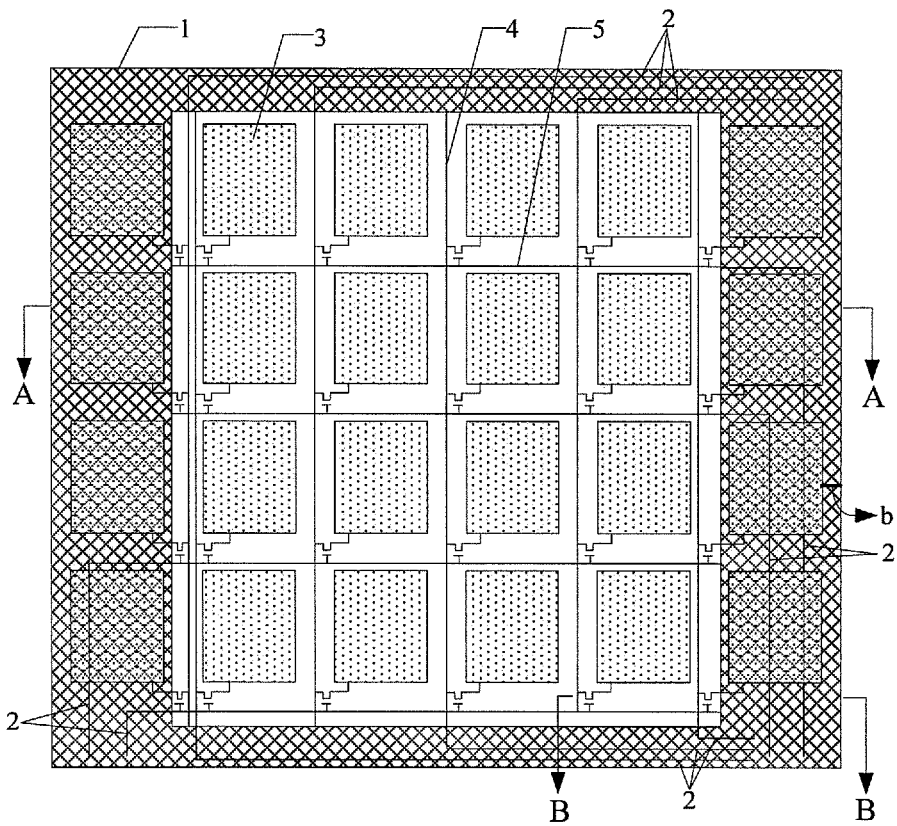
FIG. 2 is a schematic diagram of the structure of an array substrate provided by one embodiment of the present disclosure.
Figure 3:
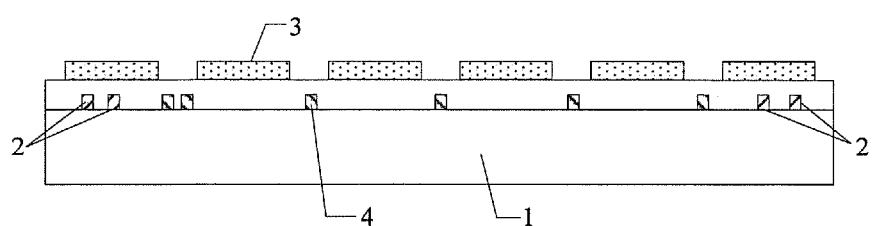
FIG. 3 is a sectional view along AA direction of FIG. 2.
Figure 4:
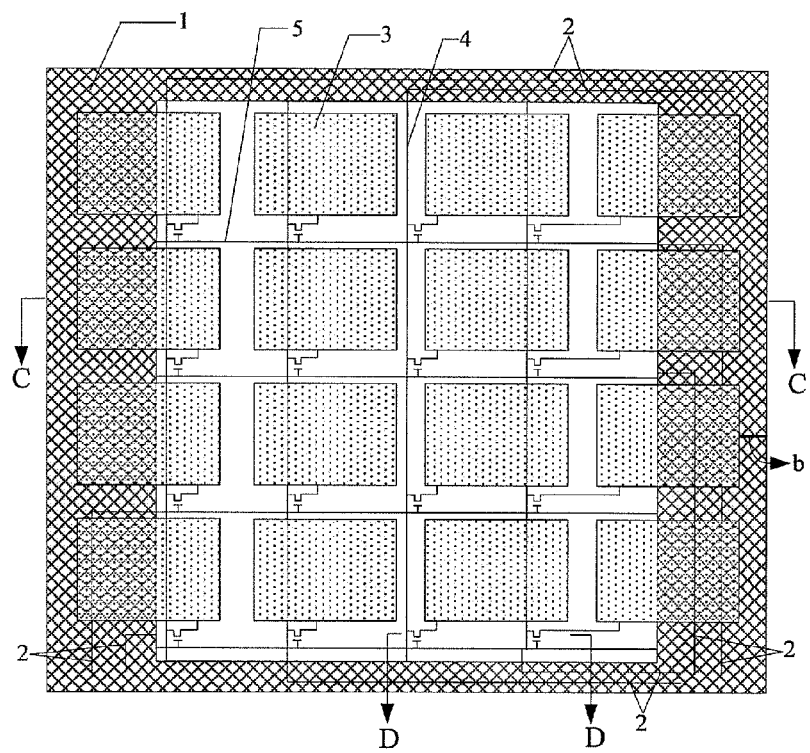
FIG. 4 is a schematic diagram of the structure of an array substrate provided by another embodiment of the present disclosure.
Figure 5:
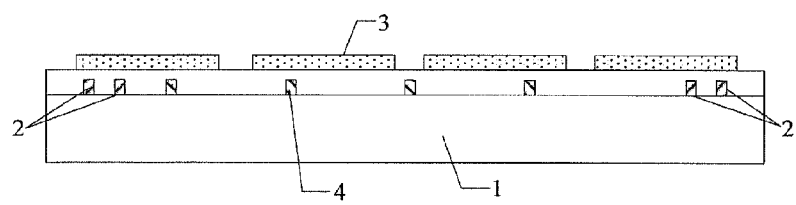
FIG. 5 is a sectional view along CC direction of FIG. 4.

An array substrate is provided by an embodiment of the present disclosure, as shown in FIG. 2-FIG. 5. FIG. 3 is a sectional view along AA direction of FIG. 2, and FIG. 5 is a sectional view along CC direction of FIG. 4. The array substrate comprises: a base substrate 1, and peripheral routes 2 and a plurality of pixel structures 3 located on base substrate 1.

An orthographic projection of at least one pixel structure 3 on base substrate 1 has an overlapping region with the orthographic projection of the periphery region (as shown by the grid shading portion in FIG. 2-FIG. 5), where peripheral routes 2 reside, on base substrate 1.

As shown in FIG. 3 and FIG. 5, the film layer where peripheral routes 2 reside is located between the film layer where pixel structures 3 reside and base substrate 1. Alternatively, the film layer where peripheral routes 2 reside is located at a side of the film layer, where pixel structures 3 reside, facing away from base substrate 1.

In the above array substrate provided by an embodiment of the present disclosure, the orthographic projection of at least one pixel structure on the base substrate has an overlapping region with the orthographic projection of the periphery region, where the peripheral routes reside, on the base substrate. When the above array substrate provided by an embodiment of the present disclosure is applied to a top-emitting OLED (i.e. the encapsulating substrate side being the light-emitting side), the film layer where the peripheral routes reside is located between the film layer where the pixel structures reside and the base substrate. Even in instances where the orthographic projection of the pixel structures on the base substrate and the orthographic projection of the peripheral routes on the base substrate overlap each other, normal display of the OLED would not be affected. Likewise, when the above array substrate provided by an embodiment of the present disclosure is applied to a bottom-emitting OLED (i.e. the array substrate side being the light-emitting side), the film layer where the peripheral routes reside is located at a side of the film layer where the pixel structures reside facing away from the base substrate, where even if the orthographic projection of the pixel structures on the base substrate and the orthographic projection of the peripheral routes on the base substrate overlap each other, normal display of the OLED would not be affected. Thus, the display region of the above array substrate provided by an embodiment of the present disclosure can be enlarged to cover a part or all of the periphery region where the peripheral routes reside and this, compared with a structure without the overlapping of display region 101 and periphery region 102 in a prior art OLED array substrate as shown in FIG. 1, can narrow down the bezel width of the organic electroluminescent display panel (as shown by "b" in FIG. 2 and FIG. 4). Further, when the display region extends to cover all of the periphery region where the peripheral routes reside, the organic electroluminescent display panel makes a bezel-less display.

It should be noted that in the above array substrate provided by an embodiment of the present disclosure, the peripheral routes are electrically connected with the gate lines and data lines in the array substrate. The arrangement of the peripheral routes is similar to that of the peripheral routes in a prior art array substrate, and the periphery region where the peripheral routes reside is similar to periphery region 102 in the prior art OLED array substrate as shown in FIG. 1, which will not be repeated here.

In specific implementations, the orthographic projection of the pixel structures on the base substrate has an overlapping region with the orthographic projection of the periphery region, where the peripheral routes reside, on the base substrate, as shown in FIG. 2 and FIG. 3, which can be realized by additionally arranging a pixel structure 3 at the periphery region, where peripheral routes 2 reside. In instances where the size of pixel structure 3 remains constant (i.e. two adjacent gate lines and two adjacent data lines define one pixel structure) or, as shown in FIG. 4 and FIG. 5, this can also be realized by increasing the size of each pixel structure 3 (i.e. each pixel structure occupying an area larger than the area of the region defined by two adjacent gate lines and two adjacent data lines), which cases will not be restricted here.

In specific implementations, when making the display region extend to cover a part or all of the periphery region where the peripheral routes reside by increasing a number of the pixel structures, the above array substrate provided by an embodiment of the present disclosure, as shown in FIG. 2 and FIG. 3, may further comprise: a plurality of data lines 4 and a plurality of gate lines 5 located on base substrate 1, which intersect each other and mutually insulative. Each data line 4 and each gate line 5 have orthographic projections on base substrate 1, which are non-overlapping with the orthographic projection of peripheral routes 2 on base substrate 1, i.e. the gate lines 5 and the data lines 4 corresponding to each pixel structure 3 are both located in a region enclosed by the periphery region (as shown by the grid shading portion in FIG. 2 and FIG. 3) where peripheral routes 2 reside. For pixel structures 3 located outside the overlapping region, and gate lines 5 and data lines 4 corresponding to such pixel structures 3, two adjacent data lines 4 and two adjacent gate lines 5 define one pixel structure 3; the gate lines 5 and the data lines 4 corresponding to pixel structures 3 located in the overlapping region (i.e. added pixel structures as compared to a prior art array substrate) are not arranged in the overlapping region, but in a region outside the overlapping region, because peripheral routes 2 are usually arranged at the same layer as gate lines 5 or data lines 4. In order to prevent an electrical connection between the gate line 5 and the data line 4 corresponding to the pixel structure 3 in the overlapping region and peripheral routes 2, which could lead to a short circuit problem, it is necessary to arrange the gate lines 5 and the data lines 4 corresponding to the pixel structures 3 in the overlapping region at a region outside the overlapping region. Specifically, the pixel structures 3 located in the overlapping region can be connected to the corresponding gate lines 5 and data lines 4 located outside the overlapping region by a via hole.

Figure 6:
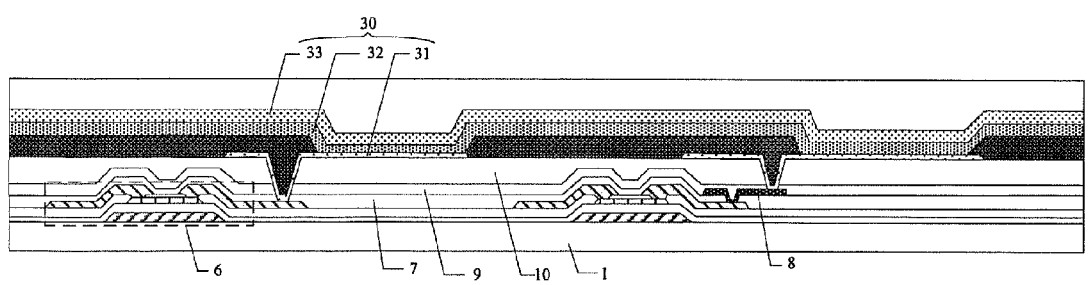
FIG. 6 is a sectional view along BB direction of FIG. 2.

In specific implementation, when the above array substrate provided by an embodiment of the present disclosure is applied to a top-emitting OLED (i.e. the film layer where the peripheral routes reside is located between the film layer where pixel structures reside and the base substrate), the above array substrate, as shown in FIG. 6 (a sectional view along BB direction of FIG. 2), may further comprise: a thin film transistor 6 corresponding to each pixel structure 3, a first passivation layer 7, a metal bridge 8 and a second passivation layer 9, which are located between base substrate 1 and the film layer where pixel structures 3 reside and are arranged in sequence on base substrate 1. FIG. 6 is an example of a pixel structure 3 as an organic electroluminescent structure 30 comprising an anode 31, a light emitting layer 32 and a cathode 33, where the gate line 5 and data line 4 corresponding to organic electroluminescent structure 30 (located in the overlapping region) are located outside the overlapping region, the thin film transistor 6 corresponding to the organic electroluminescent structure 30 in the overlapping region is also located outside the overlapping region. This organic electroluminescent structure 30 can be electrically connected to the corresponding thin film transistor 6 by a via hole. Specifically, a drain of thin film transistor 6 is electrically connected to metal bridge 8 by a first via hole penetrating first passivation layer 7, and metal bridge 8 is electrically connected to anode 31 in organic electroluminescent structure 30 by a second via hole penetrating second passivation layer 9. A drain of thin film transistor 6 corresponding to an organic electroluminescent structure 30 located outside the overlapping region is electrically connected to anode 31 in the organic electroluminescent structure 30 by a third via hole penetrating first passivation layer 7 and second passivation layer 9. The connection between an organic electroluminescent structure 30 located outside the overlapping region and a thin film transistor 6 corresponding to the organic electroluminescent structure 30 is similar to that of existing structures, which will not be repeated here. Further, as shown in FIG. 6, an organic resin layer 10 may be arranged on second passivation layer 9, while the second via hole penetrates organic resin layer 10 and second passivation layer 9, and the third via hole penetrates organic resin layer 10, second passivation layer 9 and first passivation layer 7, where a functionality of the organic resin layer 10 is the same as that of an organic resin layer in a prior art OLED, which will not be repeated here.

In specific implementation, when the above array substrate provided by an embodiment of the present disclosure is applied to a bottom-emitting OLED, i.e. the film layer where the peripheral routes reside is located at a side of the film layer where the pixel structures reside facing away from the base substrate, the above array substrate provided by an embodiment of the present disclosure may further comprise: a second passivation layer, a metal bridge, a first passivation layer and a thin film transistor corresponding to each pixel structure, arranged in sequence at the side of the film layer where the pixel structures reside facing away from the base substrate. Taking a pixel structure as an organic electroluminescent structure for example, since the gate line and the data line corresponding to the organic electroluminescent structure (which is located in the overlapping region) are located outside the overlapping region, the thin film transistor corresponding to the organic electroluminescent structure in the overlapping region is also located outside the overlapping region; and this organic electroluminescent structure can be electrically connected to the corresponding thin film transistor by a via hole. Specifically, a drain of the thin film transistor is electrically connected to the metal bridge by a first via hole penetrating the first passivation layer, and the metal bridge is electrically connected to the anode in the organic electroluminescent structure by a second via hole penetrating the second passivation layer. A drain of the thin film transistor corresponding to an organic electroluminescent structure located outside the overlapping region is electrically connected to the anode in the organic electroluminescent structure by a third via hole penetrating the first passivation layer and the second passivation layer. The specific implementation of the above array substrate provided by an embodiment of the present disclosure being applied to a bottom-emitting OLED is similar to the embodiment of its being applied to a top-emitting OLED, so the duplicate details will not be repeated here.

In specific implementations, when making the display region extends to cover a part or all of the periphery region where the peripheral routes reside by increasing a size of each pixel structure (as shown in FIG. 4 and FIG. 5), the array substrate may further comprise: a plurality of data lines 4 and a plurality of gate lines 5 located on base substrate 1, which intersect each other and mutually insulative. Each data line 4 and each gate line 5 have orthographic projections on base substrate 1, which are non-overlapping with the orthographic projection of peripheral routes 2 on base substrate 1, by which each gate line 5 and each data line 4 can be prevented from an electrical connection with peripheral routes 2, which could lead to a short circuit problem. A width of each pixel structure 3 along the direction in which gate lines 5 extend is larger than a distance between the two data lines 4 adjacent to the pixel structure 3, by which the width of each pixel structure 3 along the direction in which gate lines 5 extend can be increased such that pixel structure 3 extends in the direction, in which gate lines 5 extend, to cover a part or all of the periphery region where peripheral routes 2 reside, thus enabling the display region to extend in the direction, in which gate lines 5 extend, to cover a part or all of the periphery region where peripheral routes 2 reside, and making the OLED realize the design of Narrow Bezel in the direction in which gate lines 5 extend. Alternatively, a width of each pixel structure 3 along the direction in which data lines 4 extend is larger than a distance between the two gate lines 5 adjacent to the pixel structure 3, by which the width of each pixel structure 3 along the direction in which data lines 4 extend can be increased such that pixel structure 3 extends in the direction, in which data lines 4 extend, to cover a part or all of the periphery region where peripheral routes 2 reside, thus enabling the display region to extend in the direction, in which data lines 4 extend, to cover a part or all of the periphery region where peripheral routes 2 reside, and making the OLED realize the design of Narrow Bezel in the direction in which data lines 4 extend. As yet another alternative, the widths of each pixel structure 3 along both directions in which gate lines 5 and data lines 4 extend can be increased simultaneously, making the OLED a Narrow Bezel design in both directions in which gate lines 5 and data lines 4 extend, which cases will not be restricted here. FIG. 4 and FIG. 5 are only examples illustrated with increasing the width of each pixel structure 3 along the direction in which gate lines 5 extend.

In specific implementations, when increasing the size of each pixel structure is adopted, since each pixel structure has an overlapping region with the gate lines and/or data lines, in order to avoid impact on normal display of the OLED, it is necessary to arrange a positional relationship between each pixel structure and a thin film transistor corresponding to that pixel structure based on a type of the OLED (i.e. a top-emitting or a bottom-emitting type). Specifically, when the above array substrate provided by an embodiment of the present disclosure is applied to a top-emitting OLED, it is necessary to arrange the thin film transistor corresponding to each pixel structure between the pixel structure and the base substrate; when the above array substrate provided by an embodiment of the present disclosure is applied to a bottom-emitting OLED, it is necessary to arrange each pixel structure between the thin film transistor corresponding to the pixel structure and the base substrate.

Figure 7:
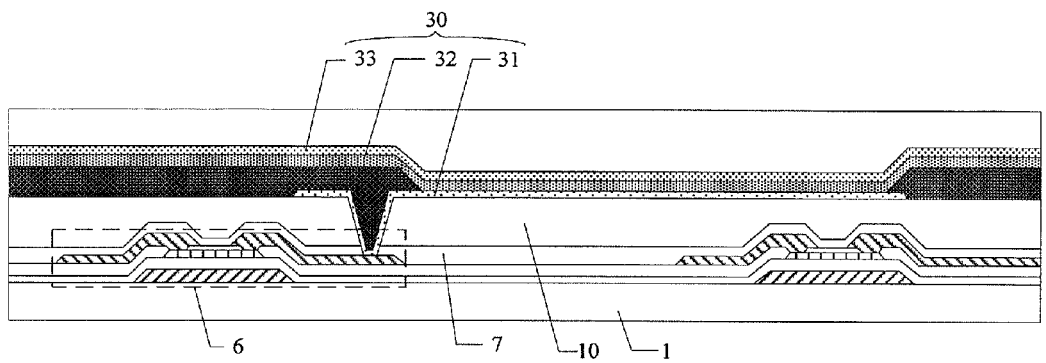
FIG. 7 and FIG. 8 are respectively sectional views along DD direction of FIG. 4.

In specific implementations, when the above array substrate provided by an embodiment of the present disclosure is applied to a top-emitting OLED (i.e. the film layer where the peripheral routes reside is located between the film layer where pixel structures reside and the base substrate), the above array substrate provided by an embodiment of the present disclosure, as shown in FIG. 7 which is a sectional view along DD direction of FIG. 4, may further comprise: a thin film transistor 6 corresponding to each pixel structure 3 and a first passivation layer 7, which are located between base substrate 1 and the film layer where pixel structures 3 reside and are arranged in sequence on base substrate 1. FIG. 7 is an example of a pixel structure 3 as an organic electroluminescent structure 30 comprising an anode 31, a light emitting layer 32 and a cathode 33, where anode 31 in each organic electroluminescent structure 30 is electrically connected to a drain in corresponding thin film transistor 6 by a first via hole in first passivation layer 7. Further, as shown in FIG. 7, an organic resin layer 10 may be arranged on first passivation layer 7, while the first via hole penetrates organic resin layer 10 and first passivation layer 7, where a functionality of the organic resin layer 10 is the same as that of an organic resin layer in a prior art OLED, which will not be repeated here.

It should be noted that in the above array substrate provided by an embodiment of the present disclosure, in particular when increasing the width of each organic electroluminescent structure along the direction in which the gate lines extend, and the thin film transistor being a bottom-gate structure, since an organic electroluminescent structure overlaps data lines other than the data line for loading a gray-scale signal to the organic electroluminescent structure, and the data lines are arranged at the same layer as the source and drain of the thin film transistor, it is necessary to arrange a first passivation layer so as to avoid an electrical connection between the organic electroluminescent structure and data lines other than the data line for loading a gray-scale signal to the organic electroluminescent structure, which could lead to a short circuit problem. Likewise, when increasing the width of each organic electroluminescent structure along the direction in which the data lines extend, and the thin film transistor being a top-gate structure, since an organic electroluminescent structure overlaps gate lines other than the gate line for loading a gate-scanning signal to the organic electroluminescent structure, and the gate lines are arranged at the same layer as the gate of the thin film transistor, it is necessary to arrange a first passivation layer so as to avoid an electrical connection between the organic electroluminescent structure and gate lines other than the gate line for loading a gate-scanning signal to the organic electroluminescent structure, which could lead to a short circuit problem.

Of course, when increasing the width of each electroluminescent structure along the direction in which the data lines extend and the thin film transistor being a bottom-gate structure, or when increasing the width of each electroluminescent structure along the direction in which the gate lines extend and the thin film transistor being a top-gate structure, the arrangement of the first passivation layer can be omitted, which cases will not be restricted here.

Figure 8:
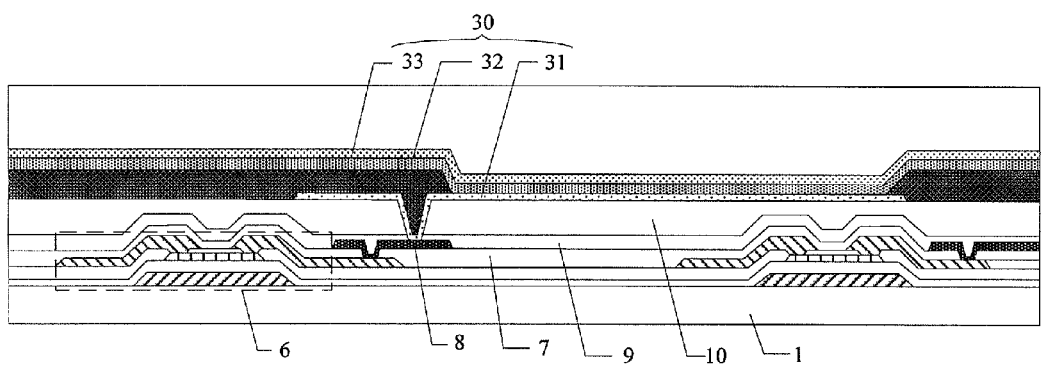

Further, the width of each organic electroluminescent structure along the direction in which the gate lines extend is substantially larger than the width between the two data lines adjacent to the electroluminescent structure, such that the anode in each electroluminescent structure is relatively distant from the drain in the corresponding thin film transistor. For example, when the anode in each organic electroluminescent structure has a larger distance from the drain in the corresponding thin film transistor than the width between the two adjacent data lines, two adjacent organic electroluminescent structures could rise to a short circuit problem. Based on this, the above array substrate provided by an embodiment of the present disclosure, as shown in FIG. 8 (FIG. 8 is another case of the sectional view along DD direction of FIG. 4), may further comprise: a metal bridge 8 and a second passivation layer 9 arranged in sequence on first passivation layer 7. Metal bridge 8 is electrically connected to a drain in thin film transistor 6 by a first via hole in first passivation layer 7, and metal bridge 8 is electrically connected to anode 31 in organic electroluminescent structure 30 by a second via hole in second passivation layer 9, and thereby the anode 31 in organic electroluminescent structure 30 and the drain in corresponding thin film transistor 6 are electrically connected by way of metal bridge 8, which is enabled to avoid the short circuit problem between two adjacent organic electroluminescent structures 30 that could be caused by the anode 31 in each organic electroluminescent structure 30 being relatively distant from the drain in the corresponding thin film transistor 6. Additionally, as shown in FIG. 8, an organic resin layer 10 may be arranged on second passivation layer 9, while the second via hole penetrates organic resin layer 10 and second passivation layer 9, where a functionality of the organic resin layer 10 is the same as that of an organic resin layer in a prior art OLED, which will not be repeated here.

Likewise, in specific implementations, when the above array substrate provided by an embodiment of the present disclosure is applied to a bottom-emitting OLED, i.e. the film layer where the peripheral routes reside is located at a side of the film layer where the pixel structures reside facing away from the base substrate, the above array substrate provided by an embodiment of the present disclosure may further comprise: a first passivation layer and a thin film transistor corresponding to each pixel structure arranged in sequence at the side of the film layer where the pixel structures reside facing away from the base substrate; taking a pixel structure as an oragnic electroluminescent structure for example, an anode in each organic electroluminescent structure is electrically connected to a drain in the corresponding thin film transistor by a first via hole in the first passivation layer.

Further, the width of each organic electroluminescent structure along the direction in which the gate lines extend is substantially larger than the width between the two data lines adjacent to the electroluminescent structure, such that the anode in each electroluminescent structure is relatively distant from the drain in the corresponding thin film transistor. For example, when the anode in each organic electroluminescent structure has a larger distance from the drain in the corresponding thin film transistor than the width between the two adjacent data lines, two adjacent organic electroluminescent structures could rise to a short circuit problem. Based on this, the above array substrate provided by an embodiment of the present disclosure may further comprise: a metal bridge and a second passivation layer arranged in sequence on the first passivation layer. The metal bridge is electrically connected to an anode in the organic electroluminescent structure by a first via hole in the first passivation layer, and the metal bridge is electrically connected to a drain in the thin film transistor by a second via hole in the second passivation layer, and thereby the anode in the organic electroluminescent structure and the drain in the corresponding thin film transistor are electrically connected by way of the metal bridge, which avoids the short circuit problem between two adjacent organic electroluminescent structures that could be caused by the anode in each organic electroluminescent structure being relatively distant from the drain in the corresponding thin film transistor. The specific implementation of the above array substrate provided by an embodiment of the present disclosure being applied to a bottom-emitting OLED is similar to the embodiment of its being applied to a top-emitting OLED, so the duplicate details will not be repeated here.

Figure 9:
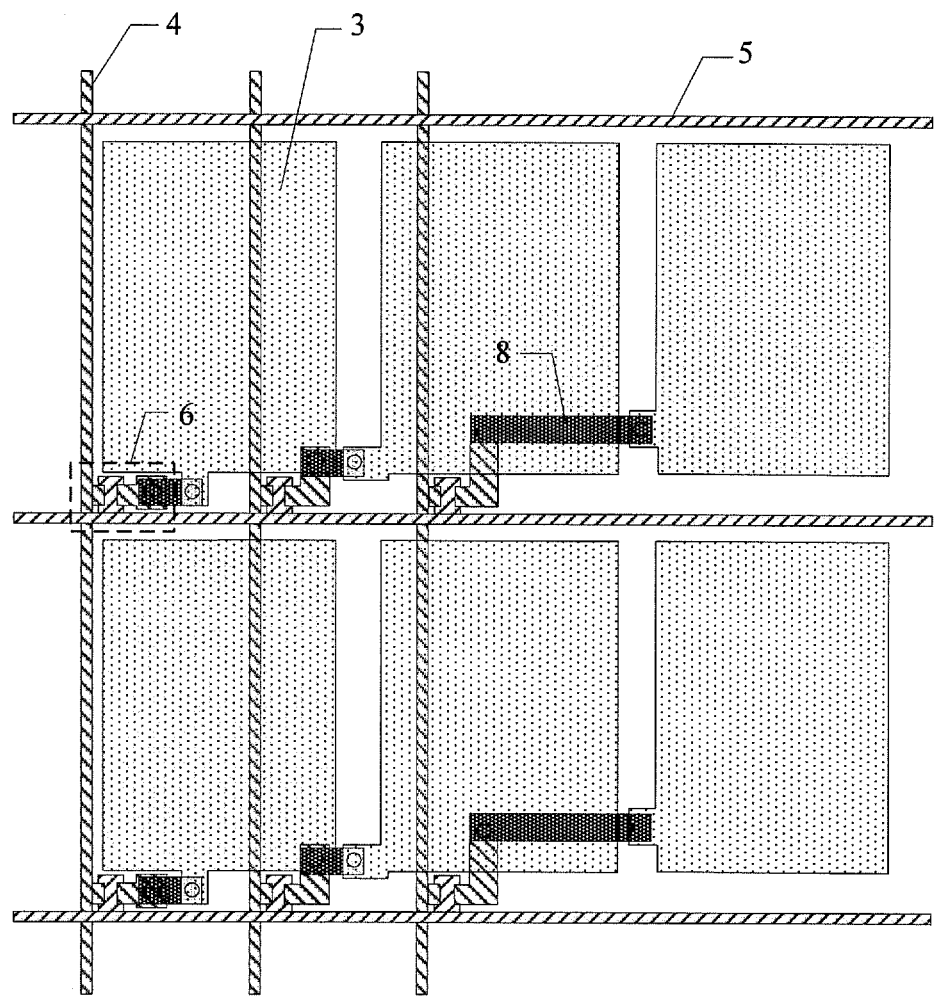
FIG. 9 is a schematic diagram of partial pixel structures in FIG. 4.

In specific implementations, when the anode in each organic electroluminescent structure is relatively distant from the drain in the corresponding thin film transistor, such that two adjacent organic electroluminescent structures are electrically connected leading to a short circuit problem, metal bridge 8 can be arranged in a bar shape, as shown in FIG. 9 (FIG. 9 is a schematic diagram of a part of the pixel structures in FIG. 4), and individual metal bridges 8 are arranged on different straight lines parallel with gate lines 5, where each metal bridge 8 can be prevented from an electrical connection to one another by way of a staggered arrangement of adjacent metal bridges 8. Further, when the film layer where the peripheral routes reside is located between the film layer where the organic electroluminescent structures reside and the base substrate, i.e. the above array substrate provided by an embodiment of the present disclosure is applied to a top-emitting OLED, since the metal bridge is located between the film layer where the organic electroluminescent structures reside and the base substrate, normal display of the OLED would not be affected even if the metal bridge overlaps the organic electroluminescent structure. When the film layer where the peripheral routes reside is located at a side of the film layer where the organic electroluminescent structures reside facing away from the base substrate, i.e. the above array substrate provided by an embodiment of the present disclosure is applied to a bottom-emitting OLED, since the metal bridge is located at the side of the film layer where the organic electroluminescent structures reside facing away from the base substrate, normal display of the OLED would not be affected even if the metal bridge overlaps the organic electroluminescent structure.

In an exemplary embodiment, the array substrate provided by an embodiment of the present disclosure may also be a GOA structure, i.e. the above array substrate provided by an embodiment of the present disclosure may further comprise a periphery circuit. In order not to affect normal display of the OLED, when the above array substrate provided by an embodiment of the present disclosure is applied to a top-emitting OLED, it may be necessary to arrange the film layer where the peripheral routes reside and the film layer where the periphery circuit resides between the film layer where the pixel structures reside and the base substrate. Alternatively, when the above array substrate provided by an embodiment of the present disclosure is applied to a bottom-emitting OLED, it is necessary to arrange the film layer where the peripheral routes reside and the film layer where the periphery circuit resides at a side of the film layer where the pixel structures reside facing away from said base substrate.

It needs to be noted that no matter whether increasing a number of the pixel structures or increasing a size of each pixel structure is adopted, the above array substrate provided by an embodiment of the present disclosure can be either applied to a top-emitting OLED or applied to a bottom-emitting OLED, which cases will not be restricted here.

The specific implementation of a manufacturing method of the above array substrate provided by an embodiment of the present disclosure is illustrated below with a specific example. For example, referring to FIG. 8, the manufacturing method specifically comprises the steps of:

(1) forming a pattern of thin film transistor 6 on base substrate 1;

(2) forming first passivation layer 7 on base substrate 1 formed with the pattern of thin film transistor 6, and forming a first via hole in first passivation layer 7 by etching;

(3) forming a pattern of metal bridge 8 on base substrate 1 formed with first passivation layer 7, wherein metal bridge 8 is electrically connected to a drain in thin film transistor 6 by the first via hole in first passivation layer 7;

(4) forming second passivation layer 9 on base substrate 1 formed with metal bridge 8;

(5) forming organic resin layer 10 on second passivation layer 9, and forming a second via hole penetrating organic resin layer 10 and second passivation layer 9; and (6) forming a pattern of organic electroluminescent structure 30 on base substrate 1 formed with the second via hole; wherein anode 31 in organic electroluminescent structure 30 is electrically connected to metal bridge 8 by the second via hole.

Based on the same inventive concept, it is also an embodiment of the present disclosure to provide a display panel, which comprises the above array substrate provided by an embodiment of the present disclosure. Reference can be made to the embodiment of the above array substrate for an implementation of the display panel, so the duplicate details will not be repeated here.

In an exemplary embodiment, the above display panel provided by an embodiment of the present disclosure may be an organic electroluminescent display panel. Of course, it may also be other display panels that are capable of carrying out the present disclosure, which cases will not be restricted here.

Based on the same inventive concept, it is also an embodiment of the present disclosure to provide a display device, which comprises the above display panel provided by an embodiment of the present disclosure. The display device may be a mobile phone, a tablet computer, a TV set, a display, a laptop, a digital photo frame, a navigator, or any other product or part with a displaying function. Reference can be made to the embodiment of the above display panel for an implementation of the display device, so the duplicate details will not be repeated here.

Of an array substrate, display panel and display device provided by an embodiment of the present disclosure, the array substrate comprises: a base substrate, and peripheral routes and a plurality of pixel structures located on the base substrate. Since the orthographic projection of at least one pixel structure on the base substrate has an overlapping region with the periphery region in which the peripheral routes reside, i.e. the pixel structure extends to cover a part or all of the periphery region where the peripheral routes reside, and since the film layer where the peripheral routes reside is located between the film layer where the pixel structures reside and the base substrate or located at a side of the film layer, where the pixel structures reside, facing away from the base substrate, normal display with the pixel structures would not be affected even if the orthographic projection of the pixel structures on the base substrate and the periphery region where the peripheral routes reside overlap each other, thus enabling the display region to be enlarged to cover a part or all of the periphery region where the peripheral routes reside. This, compared with a structure without the overlapping of the display region and the periphery region, can narrow down the bezel width of the display panel and even make it bezel-less.

Apparently, a person skilled in the art can make various modifications and variations to the present disclosure without departing from the spirit and scope of the present disclosure. In this way, if these modifications and variations of the present disclosure belong to the scope of the claims of the present disclosure and their equivalent technologies, the present disclosure is also intended to include these modifications and variations.

The invention claimed is:

1. An array substrate comprising:
a base substrate, said base substrate having a display region and a periphery region;
a plurality of film layers on a top surface of said base substrate;
a plurality of pixel structures located on at least one of the film layers;
a plurality of peripheral routes located on at least one of the film layers in said periphery region;
a plurality of data lines and a plurality of gate lines on said base substrate, which intersect each other and are mutually insulative;
a thin film transistor corresponding to each said pixel structure, said thin film transistors each having a corresponding drain;
a first passivation layer;
a metal bridge; and
a second passivation layer, wherein said thin film transistors, said first passivation layer, said metal bridge, and said second passivation layer are located between said based substrate and at least one of the film layers where said pixel structures reside and are arranged in sequence on said base substrate, and wherein said pixel structures are organic electroluminescent structures;
wherein a projection of at least one said pixel structures onto the top surface of said base substrate has an overlapping region with projection of said periphery region onto the top surface of said base substrate; and
wherein at least one of the film layers where said peripheral routes reside is located between at least one of the film layers where said pixel structures reside and said base substrate wherein each said data line and each said gate line has the projection onto the top surface of said base substrate that is non-overlapping with the projection of said peripheral routes onto the top surface of said base substrate; and
wherein, for pixel structures located outside said overlapping region and the gate lines and data lines corresponding to the pixel structures, two adjacent data lines and two adjacent gate lines define one pixel structure
wherein, for at least one of the thin film transistors corresponding to one of the organic electroluminescence structure located in said overlapping region, a corresponding drain is electrically connected to said metal bridge by a first via hole penetrating said first passivation layer, and said metal bridge is electrically connected to an anode in said organic electroluminescence structure by a second via hole penetrating said second passivation layer;
wherein, for at least one of the thin film transistors corresponding to an organic electroluminescence structure located outside said overlapping region, the corresponding drain is electrically connected to an anode in said organic electroluminescence structure by a third via hole penetrating said first passivation layer and said second passivation layer.

2. The array substrate according to claim 1, further comprising an organic resin layer arranged on said second passivation layer, said second via hole penetrating said organic resin layer and said second passivation layer, said third via hole penetrating the organic resin layer, second passivation layer and first passivation layer.

3. The array substrate according to claim 1, wherein at least one of the film layers where said peripheral routes reside is located at a side of at least one of the film layers where said pixel structures reside, facing away from said base substrate; and wherein said array substrate further comprises: a second passivation layer, a metal bridge, a first passivation layer and a thin film transistor corresponding to each said pixel structure, arranged in sequence at least one of the film layers where said pixel structures reside facing away from said base substrate; wherein said pixel structures are organic electroluminescent structures;
wherein, for one of the thin film transistor corresponding to an organic electroluminescence structure located in said overlapping region, the corresponding drain is electrically connected to said metal bridge by a first via hole penetrating said first passivation layer, and said metal bridge is electrically connected to an anode in said organic electroluminescence structure by a second via hole penetrating said second passivation layer;
wherein, for one of the thin film transistor corresponding to an organic electroluminescence structure located outside said overlapping region, the corresponding drain is electrically connected to an anode in said organic electroluminescence structure by a third via hole penetrating said first passivation layer and said second passivation layer.

4. The array substrate according to claim 1, further comprising: a plurality of data lines and a plurality of gate lines on said base substrate, which intersect each other and are mutually insulative; wherein each said data line and each said gate line has the projection onto the top surface of said base substrate that are non-overlapping with the projection of said peripheral routes onto the top surface of said base substrate;
and wherein a width of each said pixel structure along the direction in which said gate lines extend is larger than a distance between two adjacent data lines; and/or a width of each said pixel structure along the direction in which said data lines extend is larger than a distance between two adjacent gate lines.

5. The array substrate according to claim 4, wherein at least one of the film layers where said peripheral routes reside is located between at least one of the film layers where said pixel structures reside and said base substrate; and wherein said array substrate further comprises: a thin film transistor corresponding to each said pixel structure and a first passivation layer, which are located between said base substrate and at least one of the film layers where said pixel structures reside and are arranged in sequence on said base substrate; wherein said pixel structures are organic electroluminescent structures; and wherein
an anode in each said organic electroluminescent structure is electrically connected to a drain in said corresponding thin film transistor by a first via hole in said first passivation layer.

6. The array substrate according to claim 4, wherein at least one of the film layers where said peripheral routes reside is located at a side of at least one of the film layers where said pixel structures reside, facing away from said base substrate; wherein said array substrate further comprises: a first passivation layer and a thin film transistor corresponding to each said pixel structure, arranged in sequence at the side of at least one of the film layers where said pixel structures reside facing away from said base substrate; wherein each said pixel structure is an organic electroluminescent structure;
and wherein an anode in each said organic electroluminescent structure is electrically connected to a drain in said corresponding thin film transistor by a first via hole in said first passivation layer.

7. The array substrate according to claim 1, wherein said metal bridge is bar-shaped; and wherein individual said metal bridges are located on different straight lines parallel with said gate lines.

8. The array substrate according to claim 2, wherein said metal bridge is bar-shaped; and wherein individual said metal bridges are located on different straight lines parallel with said gate lines.

9. The array substrate according to claim 3, wherein said metal bridge is bar-shaped; and wherein individual said metal bridges are located on different straight lines parallel with said gate lines.

10. The array substrate according to claim 5, wherein said metal bridge is bar-shaped; and wherein individual said metal bridges are located on different straight lines parallel with said gate lines.

11. The array substrate according to claim 6, wherein said metal bridge is bar-shaped; and wherein individual said metal bridges are located on different straight lines parallel with said gate lines.

12. The array substrate according to claim 1, further comprising: a periphery circuit, said periphery circuit located on one of the film layers; wherein
at least one of the film layers where said peripheral routes reside and at least one of the film layers where said periphery circuit resides are located between at least one of the film layers where said pixel structures reside and said base substrate; or at least one of the film layers where said peripheral routes reside and at least one of the film layers where said periphery circuit resides are located at a side of at least on of the film layers where said pixel structures reside, facing away from said base substrate.

13. A display panel comprising: an array substrate according to claim 1.

14. The display panel according to claim 13, wherein said display panel is an organic electroluminescent display panel.

15. A display device, comprising: a display panel according to claim 13.

16. A display device, comprising: a display panel according to claim 14.

* * * * *